(12) United States Patent
Tsai et al.

(10) Patent No.: US 7,833,848 B2
(45) Date of Patent: Nov. 16, 2010

(54) METHOD FOR REMOVING HARD MASKS ON GATES IN SEMICONDUCTOR MANUFACTURING PROCESS

(75) Inventors: Hung Chih Tsai, Kaohsiung County (TW); Chih Chieh Chen, Taoyuan County (TW); Sheng Chen Chung, Hsin-Chu (TW); Kong Beng Thei, Hsin-Chu Country (TW); Harry Chuang, Austin, TX (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 307 days.

(21) Appl. No.: 11/864,415

(22) Filed: Sep. 28, 2007

(65) Prior Publication Data

US 2009/0087955 A1 Apr. 2, 2009

(51) Int. Cl.
*H01L 21/339* (2006.01)
*H01L 21/00* (2006.01)
*H01L 21/8238* (2006.01)

(52) U.S. Cl. ...................................... 438/154; 438/199
(58) Field of Classification Search ......... 438/153–154, 438/199; 257/E21.638
See application file for complete search history.

(56) References Cited

U.S. PATENT DOCUMENTS

2006/0102962 A1 5/2006 Saito et al.

2007/0057331 A1* 3/2007 Satou et al. ................. 257/384
2007/0231983 A1* 10/2007 Shifren et al. ............... 438/197

FOREIGN PATENT DOCUMENTS

CN 1893028 A 1/2007

OTHER PUBLICATIONS

Office Action dated Oct. 9, 2009 for 2008102119433 which is a corresponding Chinese application that cites CN1893028A, and US 20060102962.

* cited by examiner

*Primary Examiner*—Ha Tran T Nguyen
*Assistant Examiner*—Valerie Brown
(74) *Attorney, Agent, or Firm*—WPAT, P.C.; Anthony King

(57) ABSTRACT

A method for removing hard masks on gates in a semiconductor manufacturing process is conducted as follows. First of all, a first gate and a second gate with hard masks are formed on a semiconductor substrate, wherein the second gate is larger than the first gate. The first gate and second gate could be associated with silicon-germanium (SiGe) source and drain regions to form p-type transistors. Next, a photoresist layer is deposited, and an opening of the photoresist layer is formed on the hard mask of the second gate. Then, the photoresist layer on the first and second gates is removed completely by etching back. Because there is no photoresist residue, the hard masks on the first and second gates can be removed completely afterwards.

13 Claims, 5 Drawing Sheets

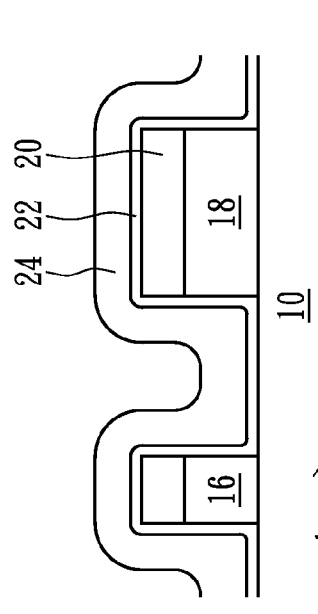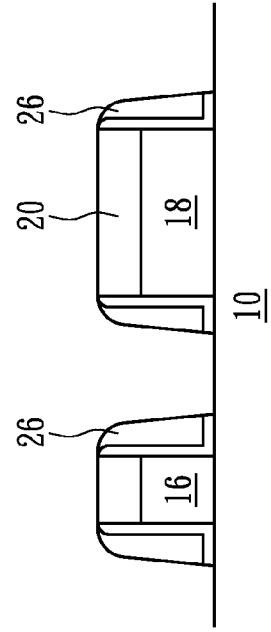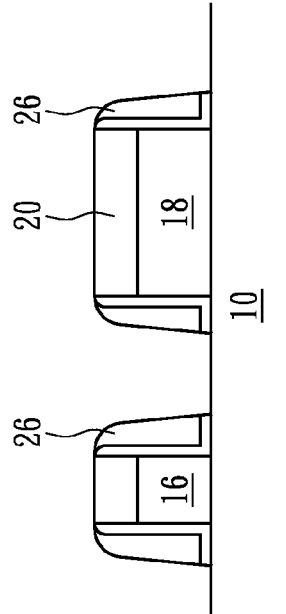
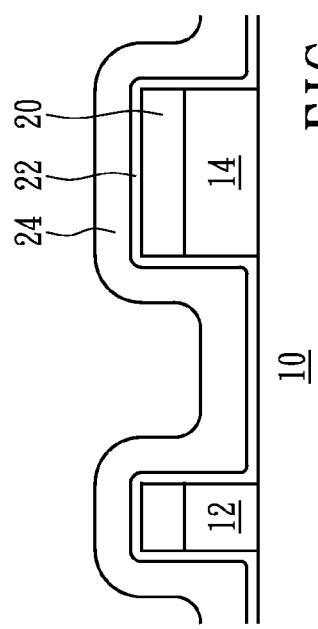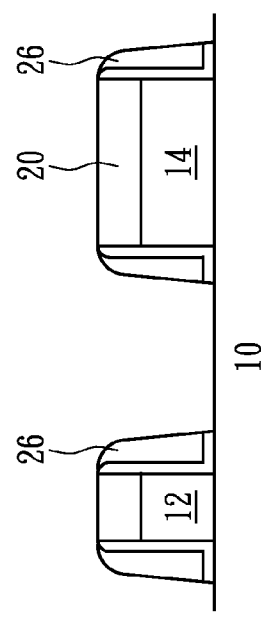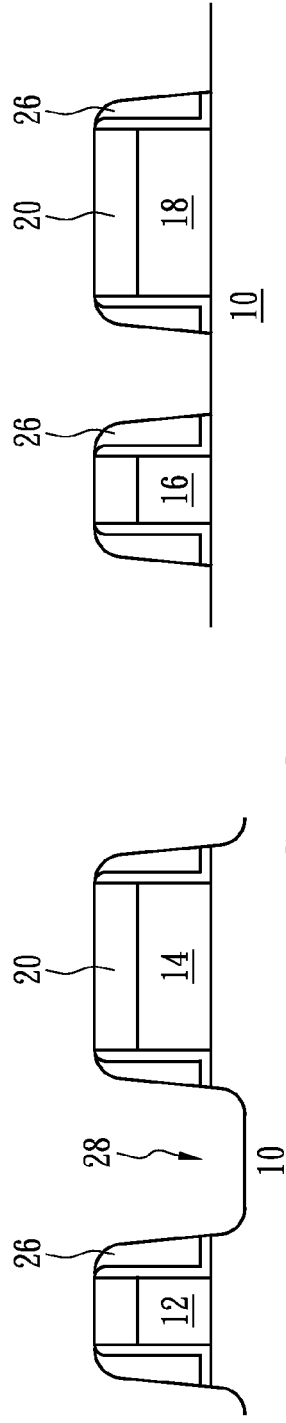
FIG. 1 (Prior Art)
FIG. 2 (Prior Art)
FIG. 3 (Prior Art)

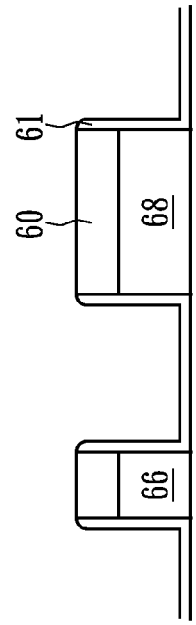
FIG. 8
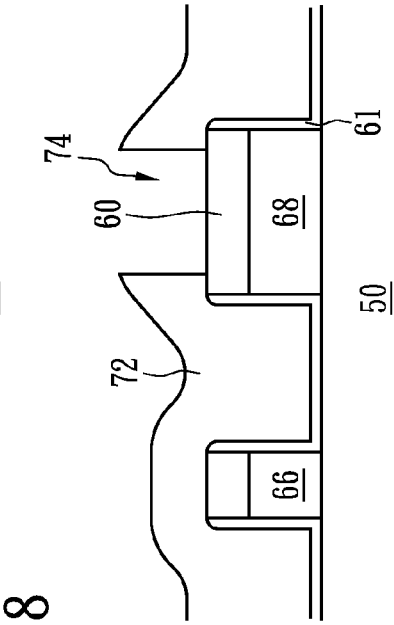
FIG. 9
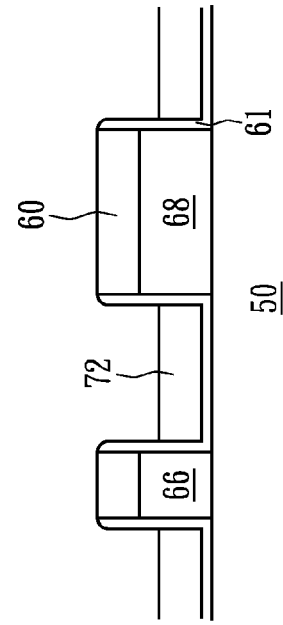
FIG. 10
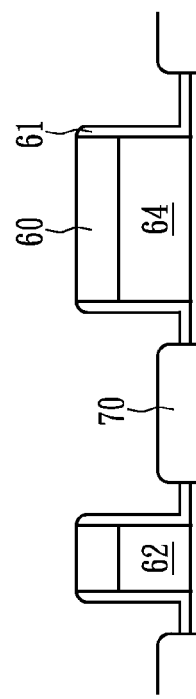
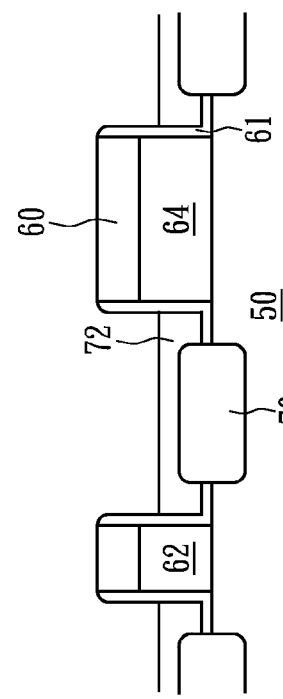

US 7,833,848 B2

METHOD FOR REMOVING HARD MASKS ON GATES IN SEMICONDUCTOR MANUFACTURING PROCESS

BACKGROUND OF THE INVENTION (A) Field of the Invention

The present invention relates to a semiconductor manufacturing process, particularly to a method for removing hard masks on gates in a semiconductor manufacturing process.

(B) Description of Related Art

SiGe is the alloy of silicon and germanium. This semiconductor material is commonly used in the integrated circuit manufacturing industry, where it is employed for producing heterojunction bipolar transistors or as a strain-inducing layer for CMOS transistors. This relatively new technology offers interesting opportunities in the manufacturing structure of mixed-signal circuit and analog circuit IC design.

As shown in FIG. 1, a polysilicon gate 12 for a small PMOS transistor and a polysilicon gate 14 for a large PMOS transistor are formed on a silicon substrate 10. In addition, a polysilicon gate 16 for a small NMOS transistor and a polysilicon gate 18 for a large NMOS transistor are formed on the substrate 10 also. Oxide hard masks 20 are formed on the polysilicon gates 12, 14, 16 and 18 to define the areas of the polysilicon gates 12, 14, 16 and 18. A silicon oxide layer 22, e.g., a tetraethoxysilane (TEOS) layer, of 40 angstroms and a silicon nitride layer 24 of 250 angstroms are formed afterwards. The silicon oxide layer 22 acts as a buffer to reduce stress that may generate between the silicon nitride layer 24 and the gates 12, 14, 16 and 18. As shown in FIG. 2, the semiconductor structure shown in FIG. 1 is subjected to anisotropic etching to form nitride spacers 26 beside the gate structure consisting of the polysilicon gate 12, 14, 16 or 18 and the oxide hard mask 20 thereon. Sequentially, recesses 28 are formed beside the gates 12 and 14 by lithography process and followed by dry etching as shown in FIG. 3. As shown in FIG. 4, SiGe blocks 30 are formed by epitaxy (epi) process at the recesses 28, and then the nitride spacers 26 are removed by phosphoric acid solution. The SiGe blocks 30 serve as sources and drains for the PMOS transistors. Because the polysilicon gates 12, 14, 16 and 18 are protected by the nitride spacers 26, SiGe will not form on the polysilicon gates 12, 14, 16 and 18 during the SiGe epi process. In FIGS. 5 and 6, a photoresist layer 32 is deposited and followed by etching back. According to the nature of photoresist deposition, the photoresist layer 32 tends to deposit with significant bulges over the large polysilicon gates 14 and 18. Due to the bulges over the large gates 14 and 18 and the loading effect, i.e., PR loading effect on a region of a larger area, the photoresist on the oxide hard masks 20 of the polysilicon gates 14 and 18 may not be removed completely. Consequently, photoresist residues 34 may occur on the hard masks 20 of the polysilicon gates 14 and 18. In FIG. 7, the oxide hard masks 20 are removed by dry etching and wet etching. Because the photoresist residues 34 substantially act as a mask in the process to remove the oxide hard masks 20, the oxide hard masks 20 are difficult to remove completely, and hard mask residues 36 are very likely to be formed on the polysilicon gates 14 and 18.

As a result, the residues of the hard mask film will significantly reduce the process window of contact etching, and therefore high contact resistance issues, e.g., an Rc open issue (contact resistance is infinite), may occur.

SUMMARY OF THE INVENTION

The present invention provides a method for removing hard masks on gates in a semiconductor manufacturing process, e.g., relating to SiGe source and drain structure, with a view to eliminate hard mask residues on the gates, especially for gates with large areas, so as to increase the process window for contact etching and resolve high contact resistance issues.

In accordance with one embodiment of the present invention, a method for removing hard masks on gates in a semiconductor manufacturing process is conducted as follows. First of all, a first gate and a second gate with hard masks are formed on a semiconductor substrate, wherein the second gate is larger than the first gate. In an embodiment, the first gate and second gate are associated with silicon-germanium (SiGe) source and drain regions to form p-type transistors. Next, a photoresist layer is deposited, and an opening of the photoresist layer is formed on the hard mask of the second gate. Then, the photoresist layer on the first and second gates is removed completely by etching back. Because there is no photoresist residue, the hard masks on the first and second gates can be removed completely afterwards.

Because both the deposition of the photoresist layer and exposure to form the opening can be performed in the same lithography machine, they can be combined in a single process stage. Accordingly, the invented process is cost competitive compared with the conventional method.

BRIEF DESCRIPTION OF THE DRAWINGS

The advantages of the present invention will become apparent upon reading the following description and upon reference to the accompanying drawings in which:

FIGS. 1 through 7 illustrate a known method for removing hard masks on gates in a semiconductor manufacturing process; and FIGS. 8 through 11 illustrate the method for removing hard masks on gates in a semiconductor manufacturing process in accordance with the present invention.

DETAILED DESCRIPTION OF THE INVENTION

Figure 4:
Figure 5:
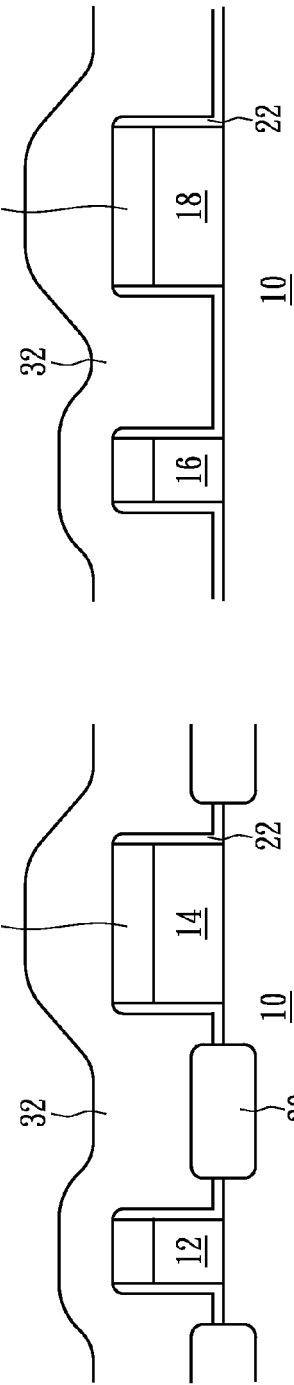
Figure 6:
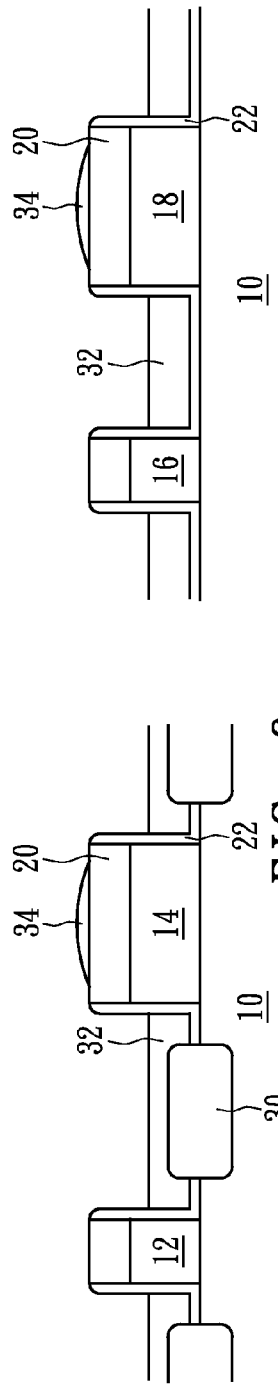
Figure 7:
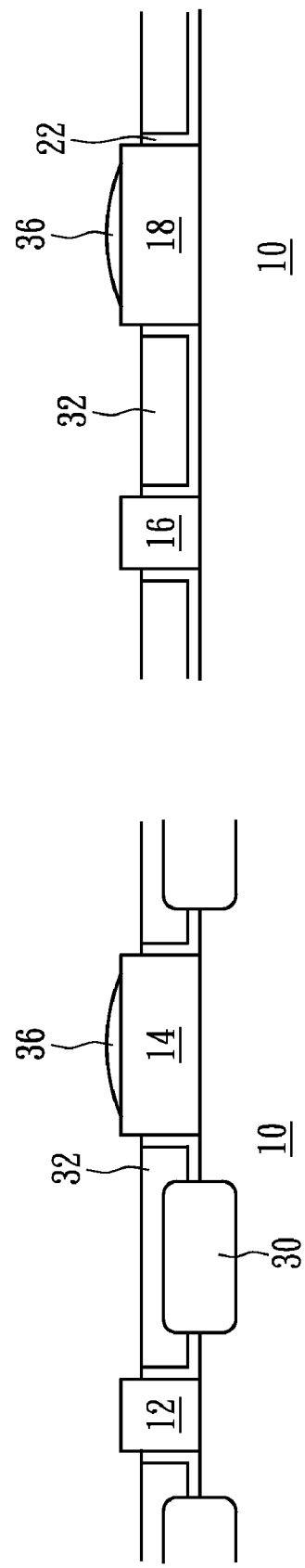

First of all, the process shown in FIGS. 1 through 4 is performed to form a semiconductor structure on a semiconductor substrate 50 as shown in FIG. 8, with the semiconductor structure including a first gate 62, a second gate 64, a third gate 66, and a fourth gate 68. The first gate 62 and second gate 64 are associated with SiGe blocks 70 serving as source and drain regions to form the PMOS transistors, whereas the third gate 66 and fourth gate 68 are in connection to NMOS transistors. The gates 62, 64, 66 and 68 are covered with hard masks 60 thereon, and silicon oxide layers 61 are formed on the sidewalls of the gates 62, 64, 66 and 68 and extend to the surface of the adjacent silicon substrate 50. Preferably, the gates 62, 64, 66 and 68 are composed of polysilicon, and the hard masks 60 are composed of silicon oxide. The second gate 64 is larger than the first gate 62, whereas the fourth gate 68 is larger than the third gate 66.

In FIG. 9, a photoresist layer 72 of 6,000 angstroms is deposited, and sections of the photoresist layer 72 over the second gate 64 and the fourth gate 68 are removed to form openings 74. The openings 74 are formed by adding an extra mask in the lithography process. In other words, most of the photoresist layer 72 over the hard masks 60 of the second gate 64 and fourth gate 68 are removed. Because the deposition of photoresist layer 72 and the exposure to form the openings 74 can be conducted in the same lithography machine, the cost will not increase. In an embodiment of a logic circuit, the openings 74 of approximately 1.5×1.5 µm² are formed above the gates 64 and 68 whose areas are larger than 2×2 µm².

Figure 11:
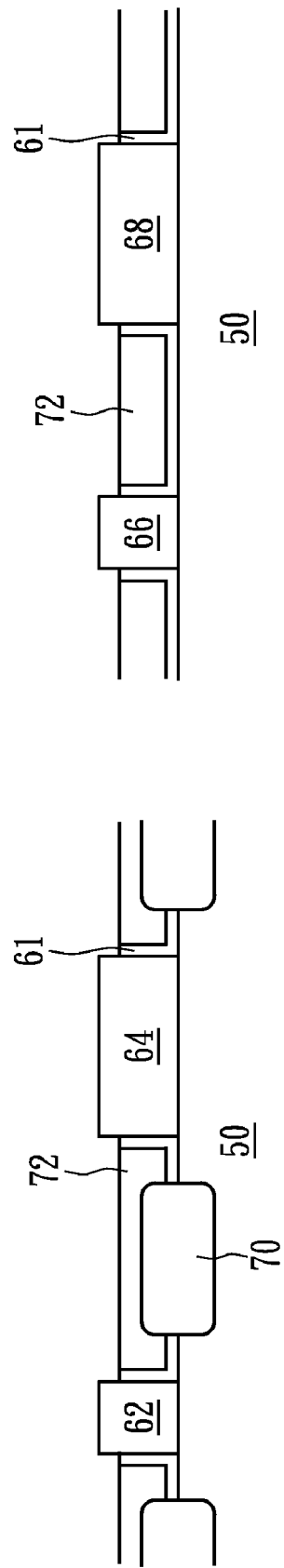

As shown in FIG. 10, the photoresist layer 72 is subjected to an etching back process to remove a portion of the photoresist layer 72. Because most of the photoresist layer 72 above the second gate 64 and the fourth gate 68 has already been removed during the etching back process, the photoresist residue caused by the loading effect or photoresist bulge deposits will not occur. In FIG. 11, the hard masks 60 are removed by dry etching and wet etching. Because there are no photoresist residues on the hard masks 60 of the second gate 64 and the fourth gate 68, there is no hard mask residue remaining on the second gate 64 and the fourth gate 68. The remaining photoresist layer 72 is employed to protect the gates 62, 64, 66 and 68, the semiconductor substrate 50 and shallow trench isolations (not shown) while the hard masks 60 are being removed.

In accordance with the present invention, the hard mask residue no longer exists. Therefore, high contact resistance or Rc open (contact resistance is infinite) issues can be effectively resolved; and as such the process window for contact etching can be increased.

The above-described embodiments of the present invention are intended to be illustrative only. Numerous alternative embodiments may be devised by those skilled in the art without departing from the scope of the following claims.

What is claimed is:

1. A method, comprising the steps of:
   forming a first gate and a second gate on a semiconductor substrate, wherein the second gate is larger than the first gate;
   forming a first hard mask and a second hard mask on the top of the first gate and the top of the second gate, respectively;
   forming a photoresist layer over the semiconductor substrate, the first hard mask and the second hard mask, wherein the photoresist layer has an opening exposing only a central portion of the second hard mask;
   removing the photoresist layer from the first hard mask and the second hard mask; thereby
   eliminating the occurrence of photoresist residue caused by the loading effect or photoresist bulge deposits; and
   removing the first hard mask and the second hard mask.

2. The method in accordance with claim 1, wherein the first gate and second gate are associated with silicon-germanium (SiGe) source and drain regions to form p-type transistors.

3. The method in accordance with claim 1, wherein the first hard mask and the second hard mask are made of silicon oxide.

4. The method in accordance with claim 1, wherein the first and second gates are polysilicon gates.

5. The method in accordance with claim 1, wherein the photoresist layer and the opening are formed in a same lithography machine.

6. The method in accordance with claim 5, wherein the opening is formed by an exposure process.

7. A method, comprising:
   forming a first PMOS transistor comprising a first gate and silicon-germanium (SiGe) source/drain regions on a substrate;
   forming a second PMOS transistor comprising a second gate and silicon-germanium (SiGe) source/drain regions on the substrate, wherein the second gate is larger than the first gate;
   forming a first hard mask and a second hard mask on the top of the first gate and the top of the second gate respectively;
   forming a photoresist layer over the substrate, the first hard mask and the second hard mask, wherein the photoresist layer has an opening exposing only a central portion of the second hard mask;
   removing the photoresist layer from the first hard mask and the second hard mask thereby eliminating the occurrence of photoresist residue caused by the loading effect or photoresist bulge deposits; and
   removing the first hard mask and the second hard mask.

8. The method in accordance with claim 7, further comprising:
   forming a first NMOS transistor comprising a third gate on the substrate; and
   forming a second NMOS transistor comprising a fourth gate on the substrate, wherein the fourth gate is larger than the third gate.

9. The method in accordance with claim 8, further comprising:
   forming a third hard mask and a fourth hard mask on the top of the third gate and the top of the fourth gate, respectively;
   forming a photoresist layer over the substrate, the third hard mask and the fourth hard mask, wherein the photoresist layer has an opening exposing a portion of the fourth hard mask;
   removing the photoresist layer from the third hard mask and the fourth hard mask; and
   removing the third hard mask and the fourth hard mask.

10. The method in accordance with claim 7, wherein the first hard mask and the second hard mask are made of silicon oxide.

11. The method in accordance with claim 7, wherein the first and second gates are polysilicon gates.

12. The method in accordance with claim 7, wherein the photoresist layer and the opening are formed in a same lithography machine.

13. The method in accordance with claim 12, wherein the opening is formed by an exposure process.

* * * * *